United States Patent [19]

Short et al.

[11] Patent Number: 5,053,383

[45] Date of Patent: Oct. 1, 1991

[54] METHOD OF REDUCING CRITICAL CURRENT DENSITY OF OXIDE SUPERCONDUCTORS BY RADIATION DAMAGE

[75] Inventors: Kenneth T. Short; Alice E. White, both of New Providence, N.J.

[73] Assignee: AT&T Bell Laboratories, Murray Hill, N.J.

[21] Appl. No.: 174,577

[22] Filed: Mar. 29, 1988

[51] Int. Cl.$^5$ .......................... B05D 5/12; B05D 3/06
[52] U.S. Cl. ...................................... 505/1; 505/702; 505/701; 505/730; 427/62; 427/38; 427/43.1; 357/5; 250/492.3
[58] Field of Search .................. 505/1, 700, 702, 730, 505/731, 732; 427/62, 63, 38, 43.1; 357/5; 250/492.3, 492.1

[56] References Cited

PUBLICATIONS

Mankiewich et al., "Reproducible Technique for Fabrication of Thin Films of High Transition Temperature Superconductors", Appl. Phys. Lett. 51 (21) Nov. 1987, pp. 1753-1755.
"Effect of Ion Bombardment on the Critical Current of YBa$_2$Cu$_3$O$_7$ Films", by S. V. Antonenko et al., *JETP Lett.*, vol. 47, No. 5, Mar. 10, 1988, pp. 314-317.
*Physica*, vol. 126, (1984) 275-279, "Superconductivity in Ba (Pb, Bi)O$_3$".
*Zeitschr. f. Physik B-Condensed Matter*, vol. 64, pp. 189-193 (1986) "Possible High T$_c$ Superconductivity in the Ba-La-Cu-O System" by J. G. Bednorz et al.
*Physical Review Letters*, vol. 58, No. 9, Mar. 2, 1987, pp. 908-910, "Superconductivity at 93K in a New Mixed-- Phase Y-Ba-Cu-O Compound System at Ambient Pressure" by M. K. Wu et al.
*Physical Review Letters*, vol. 58, No. 9, Mar. 2, 1987, pp. 911-912, "High Pressure Study of the New Y-Ba-Cu-O Superconducting Compound System" by P. H. Hor et al.
*Physical Review Letters*, vol. 58, No. 16, Apr. 20, 1987, pp. 1676-1679, "Bulk Superconductivity at 91K in Single-Phase Oxygen-Deficient Perovskite Ba$_2$YCu$_3$O$_{9-\delta}$" R. J. Cava et al.
*Superconductor Applications:* SQUIDS and Machines, Plenum Press 1977 by B. B. Schwartz et al.
*Physical Review B*, vol. 35 (16) pp. 8821-8823 (1987) "Thin Superconducting Oxide Films" by R. B. Laibowitz et al.
*Applied Physics Letters* 51 (2), Jul. 20, 1987, "Quantum Interference Devices Made from Superconducting Oxide Thin Films", pp. 200-202, by R. H. Koch et al.
*Applied Physics Letters* 51 (2), Jul. 13, 1987, pp. 139-141, "Effects of Radiation Damage in Ion-Implanted Thin Films of Metal Oxide Superconductors" by G. J. Clark et al.

*Primary Examiner*—Norman Morgenstern
*Assistant Examiner*—Roy V. King
*Attorney, Agent, or Firm*—E. E. Pacher

[57] ABSTRACT

The critical current density $J_c$ of a superconductive oxide film can be tailored, without substantial change in the critical temperature $T_c(R=0)$, by introduction of radiation damage into the superconductor. Exemplarily, this is done by exposure to energetic (e.g., 1 MeV) ions. The ability to tailor $J_c$ permits optimization of SQUIDS and other thin film devices, and makes it possible to produce superconductive interconnects that comprise "fuses" or current limiters.

5 Claims, 2 Drawing Sheets

METHOD OF REDUCING CRITICAL CURRENT DENSITY OF OXIDE SUPERCONDUCTORS BY RADIATION DAMAGE

FIELD OF THE INVENTION

This invention pertains to methods of making a superconductive element (e.g., an interconnect between electronic subsystems, or a SQUID), and to apparatus comprising the element.

BACKGROUND OF THE INVENTION

From the discovery of superconductivity in 1911 to the recent past, essentially all known superconducting materials were elemental metals (e.g., Hg, the first known superconductor) or metal alloys and intermetallic compounds (e.g., $Nb_3Ge$, probably the material with the highest transition temperature $T_c$ known prior to 1986).

Recently, superconductivity was discovered in a new class of materials, namely, metal oxides. See, for instance, B. Batlogg, *Physica*, Vol. 126, pp. 275–279 (1984), which reviews superconductivity in barium bismuth lead oxide, and J. G. Bednorz and K. A. Muller, *Zeitschr. f. Physik B-Condensed Matter*, Vol. 64, pp. 189–193 (1986), which reports superconductivity in lanthanum barium copper oxide.

The latter report stimulated worldwide research activity, which very quickly resulted in further significant progress. The progress has resulted, inter alia, to date in the discovery that compositions in the Y-BA-Cu-system can have superconductive transition temperatures $T_c$ above 77K, the boiling temperature of liquid $N_2$ (see, for instance, M. K. Wu et al, *Physical Review Letters*, Vol. 58(9), Mar. 2, 1987, pp. 908–910; and P. H. Hor et al, ibid, pp. 911–912). Furthermore, it has resulted in the identification of the material phase that is responsible for the observed high temperature superconductivity, and in the discovery of compositions and processing techniques that result in the formation of bulk samples of material that can be substantially single phase material and can have $T_c$ above 90K (see, for instance, R. J. Cava et al, *Physical Review Letters*, Vol. 58(16) pp. 1676–1679 (1987)).

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be perhaps one of the most advantageous cryogenic refrigerant, and attainment of superconductivity at liquid nitrogen temperature was a long-sought goal which until very recently appeared almost unreachable.

For a general overview of some potential applications of superconductors see, for instance, B. B. Schwartz and S. Foner, editors, *Superconductor Applications: SQUIDS and MACHINES*, Plenum Press 1981. Among the applications are power transmission lines, rotating machinery, and superconductive magnets for e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials.

The prior art knows several techniques for producing superconductive oxide bodies, including superconductive thin films. See, for instance, U.S. patent application Ser. No. 089,296, "Robust Superconductors", filed Aug. 25, 1987 for R. E. Howard et al now abandoned; U.S. patent application Ser. No. 126,448, "Method of Producing a Layer of Superconductive Oxide, and Apparatus and Systems Comprising a Layer Produced by the Method", filed Nov. 30, 1987 for M. E. Gross et al; and R. B. Laibowitz et al, *Physical Review B*, Vol. 35(16) pp. 8821–8823 (1987). Superconductive oxide films have been deposited, for instance, by laser and electron beam evaporation, sputtering, co-precipitation, or plasma-arc spraying.

A significant portion of the research on high $T_c$ oxide superconductors is directed towards increasing the critical current density $J_c$. This is the maximum supercurrent density a body of the superconductor material can support, at a given temperature and in the absence of an applied magnetic field. Substantial progress has already been made in this respect, with $J_c > 3 \times 10^6$ A/cm$^2$ at 77K reportedly having been observed in some thin films of a variant of the prototypical "1-2-3" compound $YBa_2Cu_3O_7$. It will be appreciated that for most technological applications large $J_c$ is of the essence.

Even though in general it is desirable for a superconductor to have the highest possible $J_c$, in at least some applications this is not the case. For instance, the critical current and geometry of a SQUID (superconducting quantum-interference device) advantageously are chosen such that $2I_oL/\phi_o \approx 1$, where $I_o$ is the critical current, L is the SQUID self-inductance, and $\phi_o$ is the fundamental flux quantum. See, for instance, R. H. Koch et al, *Applied Physics Letters*, Vol. 51(3), pp. 200–202 (1987). Since the value of $\phi_o$ is a constant and L frequently can not easily be reduced beyond some value in the order of $10^{-9}$ H, the above condition can frequently only be met if $I_o$ is relatively low. This in turn may require that $J_c$ be relatively low.

In view of the need to have available superconductive films having a relatively low predetermined value of $J_c$, a simple, convenient method for reducing the $J_c$ of all or part of a thin film superconductor would be of significant interest. This application discloses such a method.

DEFINITIONS

The (Ba) cuprate system herein is the class of "perovskite" oxides of nominal general formula $Ba_{2-x}M_{1-y}X_{x+y}Cu_3O_{9-\delta}$, where M is one of Y, Eu, or La, and X is one or more optional elements different from Ba and M selected from the elements of atomic number 57–71, Sc, Ca, and Sr.

The (La) cuprate system herein is the class of oxides of nominal general formula $La_{2-x}M_xCuO_{4-\epsilon}$, where M is one or more divalent metals (e.g., Ba, Sr, Ca), and $x \geq 0.005$, and $0 \leq \epsilon \leq 0.5$.

The (Bi) cuprate system herein is the class of "perovskite" oxides of nominal general formula $X_{2+x}M_{(n-x)}Cu_{(n-1)}O_{2+2n+x/2\pm\delta}$, where n is an integer $\leq 3$ and less than 9 (typically not greater than 6), x is approximately $p/q \lesssim 0.5$ (p and q are positive integers), $0 \lesssim \delta \lesssim 0.5$, X is Bi, or Bi and Pb, and M is a divalent ion, mixture of divalent ions, or combination of trivalent and monovalent ions such that the average valence of M is substantially equal to 2. Exemplarily, M is Ca, Sr, Ba, Mg, Cd, Na, K, Y, or mixtures, thereof. Exemplary values of x are 1/10, 1/5, ¼, 2/5. An exemplary (Bi) cuprate has nominal composition $Bi_{2.2}Sr_2Ca_{0.8}Cu_2O_8$.

The critical temperature $T_c$ (R=0) is the highest temperature at which the DC resistance of a superconductive material is zero, for a small current density and in the absence of an applied magnetic field.

The "onset" temperature $T_c$ (onset) is the highest temperature at which superconductivity manifests itself in the DC resistance vs. temperature curve of a superconductive material, for a small current density and in the absence of an applied magnetic field.

THE INVENTION

Figure 1:
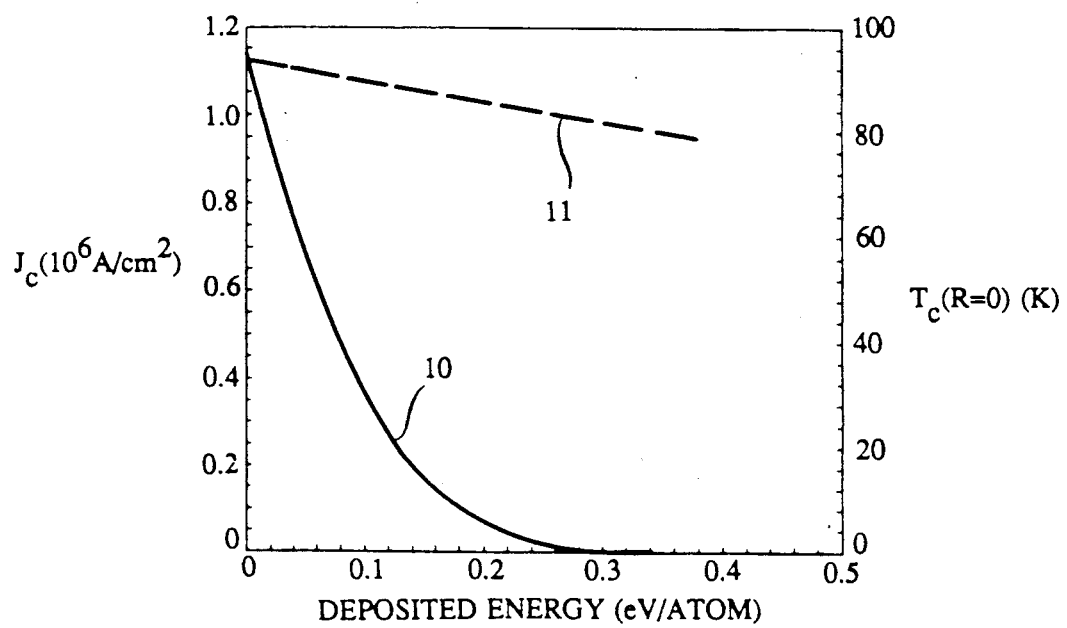
FIG. 1 shows exemplary curves of $J_c$ and $T_c$ (R=0) vs. deposited energy.

We have discovered that the critical current density of thin superconductive oxide (e.g., (Ba) cuprate) films can, without substantial effect on $T_c(R=0)$, be predictably reduced to some predetermined value $J_{cf} > 0$ by the introduction of an appropriate amount of radiation damage into the film. This discovery permits tailoring the critical current of all or part of a superconductive oxide layer, and thus makes possible, e.g., optimization of SQUIDS and other weak link devices, and provision of superconductive current limiters and "fuses", as will be discussed in more detail below.

It has been reported that at least some of the high $T_c$ oxide superconductors are quite sensitive to radiation damage. For instance, the prior art teaches that bombardment of a film of nominal composition $YBa_2Cu_3O_7$ with $5 \times 10^{13}$ cm$^{-2}$ 500 keV oxygen ions reduces $T_c(R=0)$ from about 70K to about 20K, and approximately twice that ion fluence completely destroys superconductivity in the sample. On the other hand, it also teaches that $T_c$(onset) remains substantially constant for fluences up to about $1.1 \times 10^{14}$ cm$^{-2}$. G. J. Clark et al, *Applied Physics Letters*, Vol. 51(2), pp. 139-141 (1987).

The relatively high sensitivity to radiation damage of $T_c(R=0)$ of the "1-2-3" compound was utilized by R. H. Koch et al (op. cit.) to pattern a superconductive layer such that superconducting regions were surrounded by insulator produced by ion bombardment. The thus produced device, a SQUID, was operated in the temperature range 4.2-68K.

The prior art teaching that bombardment of a (Ba) cuprate film with a relatively small dose of oxygen ions results in a drastic lowering of $T_c(R=0)$ of the film suggests that ion bombardment of high $T_c$ oxide superconductors is not a promising approach to tailoring of the superconductive properties of such films, due primarily to the fact that a substantial lowering of $T_c(R=0)$ is generally a highly undesirable result. Thus our discovery that at least one of the critical parameters of a superconductive oxide film, namely, $J_c$, can in fact be changed by a substantial amount and in a predictable manner and, significantly, without substantial change in $T_c(R=0)$, by the introduction of radiation damage into the oxide film is quite unexpected.

The inventive method comprises formation of a superconductive oxide layer (exemplarily (La) cuprate, (Ba) cuprate, or (Bi) cuprate) on an appropriate substrate. Typically this comprises deposition of the layer and treatment thereof at a relatively high temperature (dependent on the material, but typically in the range 600°-1000° C. for a time in the range 0.5-100 hours), typically in an oxygen-containing atmosphere. In at least some cases the formation process also comprises an intermediate temperature oxygenation treatment, e.g., by means of a slow cool in oxygen. The resulting film typically is substantially single phase material and has a relatively high critical current density. This initial critical current density will herein be referred to as $J_{ci}$.

Methods of depositing and heat treating superconductive cuprate layers are now well known in the art. See, for instance, R. B. Laibowitz et al, op. cit. The thus produced superconductive film frequently is patterned, e.g., by removal of unwanted portions of the superconductive layer, or by destroying the ability of part of the layer to become superconductive. The former can be carried out, for instance, by standard lithography and etching, and the latter by lithography and ion bombardment.

All or part of the superconductive film on the substrate is then exposed to a flux of energetic ions (energy typically in the range 0.2-2 MeV, ions exemplarily chosen from the group He, O, F, Ne, Ar), the ion species, energy, and fluence selected such that the resulting radiation damage is effective in reducing the critical current density of the exposed film from $J_{ci}$ to the predetermined value $J_{cf}$. Exemplarily, the deposited energy is in the range 0.02-0.4 eV/atom of the superconductive film. The "deposited energy" is intended to refer primarily to the nuclear component of the radiation damage.

The remainder of the manufacture of the inventive article is conventional. Typically, it comprises providing means for making electrical contact with the superconductive film. Furthermore, if the film is to serve as an interconnect between electronic devices, subassemblies or systems, then the devices, etc., are electrically connected to the superconductive film. Typically the superconductive film is encapsulated to provide protection against mechanical and chemical damage. Such process steps are conventional and do not require detailed discussion.

Although it is possible to carry out the ion bombardment such that a substantial portion of the ions remain in the superconductive layer, this mode of operation is currently not preferred, since it typically results in a non-uniform damage distribution. However, in some cases such non-uniform damage may even be a desired effect that results in an advantageous change of a material property. In general, however, we currently prefer bombardment that results in relatively uniform damage with depth. This can be accomplished by the use of a single energy bombardment that causes the passage of essentially all of the incident ions through the superconductive film and into the substrate. This indicates in general the use of relatively light atomic species, e.g., Ne or Ar, and/or the use of relatively high energies, typically about 1 MeV or higher. A relatively uniform damage distribution can also be achieved by bombardment using several appropriately chosen energies such that the individual non-uniform damage distributions sum to a relatively uniform distribution. Even though discussion herein is mostly in terms of ion bombardment, it will be appreciated by those skilled in the art that any technique for introducing the appropriate damage into the superconductor film is contemplated and is included. Exemplarily such damage could be produced by neutron bombardment.

FIG. 1 shows exemplary data on $J_c$ as a function of deposited energy (curve 10) for a 200 nm thick film on nominal composition $YBa_2Cu_3O_7$ on a strontium titanate substrate. The film was bombarded with 1 MeV $Ne^+$ ions, with the film substantially at room temperature.

FIG. 1 also shows $T_c(R=0)$ of the same film as a function of deposited energy (curve 11). As can be seen, the effect of the ion bombardment on $T_c(R=0)$ is minor, whereas the effect on $J_c$ is pronounced. For instance, an amount of damage that reduces $J_c$ by 50% reduces $T_c(R=0)$ by less than 4%. Typically the normalized change $\Delta T_c$ in $T_c(R=0)$ is less than 0.2, preferably less than 0.1, of the normalized change $\Delta J_c$ in $J_c$, where $\Delta T_c=(T_{cf}-T_{ci})/T_{cf}$, and $\Delta J_c=(J_{ci}-J_{cf})/J_{ci}$, and $T_{ci}$ and $T_{cf}$ are the initial and final value of the critical temperature $T_c(R=0)$, respectively.

Figure 2:
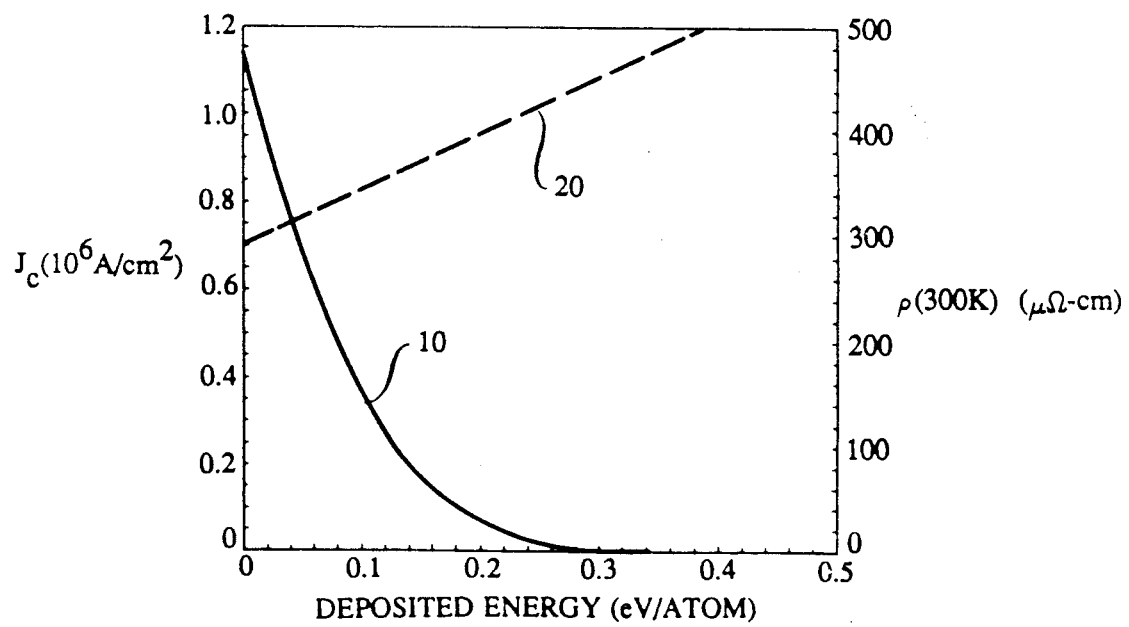
FIG. 2 similarly shows exemplary curves of $J_c$ and normal state resistivity vs. deposited energy.

FIG. 2 gives exemplary data on $J_c$ (curve 10) and room temperature resistivity (curve 20) as a function of deposited energy. The data pertain to the same film as used in FIG. 1, and were obtained under the same bombardment conditions. As can be seen, the resistivity has an essentially linear dependence on radiation damage. This dependence can, for instance, be used to monitor the process of tailoring $J_c$, either directly in the desired component or in a test structure.

We have found the relationship between $J_c$ and the deposited energy to be substantially constant for a given type of film (i.e., film having essentially the same composition, and produced in essentially the same fashion). The relationship is expected to vary somewhat if processing conditions and/or composition are changed. However, a minor amount of experimentation will typically suffice to establish the relationship for any given type of film.

Figure 3:
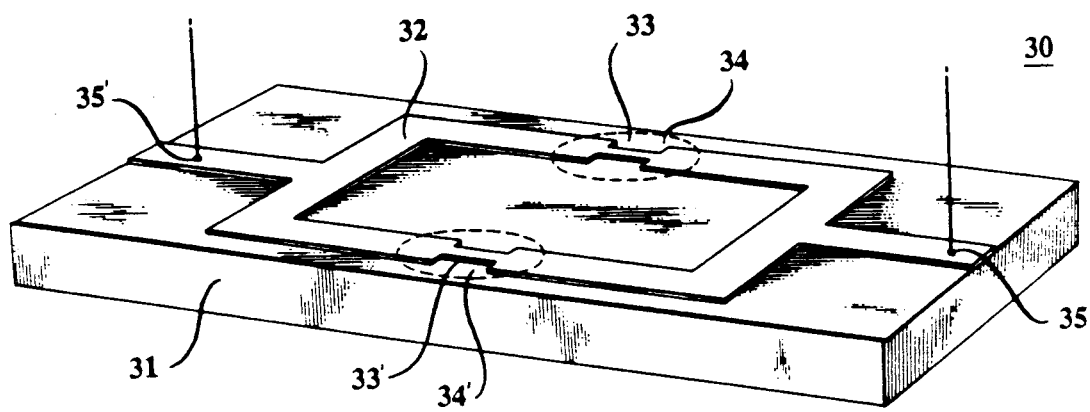
FIG. 3 schematically depicts an exemplary superconductive weak link device.

FIG. 3 schematically depicts an exemplary superconductive weak link device 30 (a planar DC SQUID) produced according to the invention. On nonsuperconductive substrate 31 is disposed a patterned superconductive film 32 comprising a bridge, each arm of the bridge comprising a narrow (weak link) segment 33 and 33', respectively. Contacts 35 and 35' serve to make electrical contact with the device. Exemplarily, the device is produced by depositing a superconductive oxide film on the substrate, patterning the film, and exposing regions 34 and/or 34' to an ion beam such that $J_c$ in the narrow segment(s) is reduced to the desired value. Alternatively, the superconductive film can be exposed to an ion beam such that the critical current of the film is reduced from $J_{ci}$ to $J_{cf}$, the film can be masked such that the portion 32 is shielded whereas the remainder of the superconductive film is exposed to an ion dose sufficient to destroy superconductivity in the exposed regions. Contacts can then be provided by any appropriate technique, e.g., by attaching leads by means of In solder.

Figure 4:
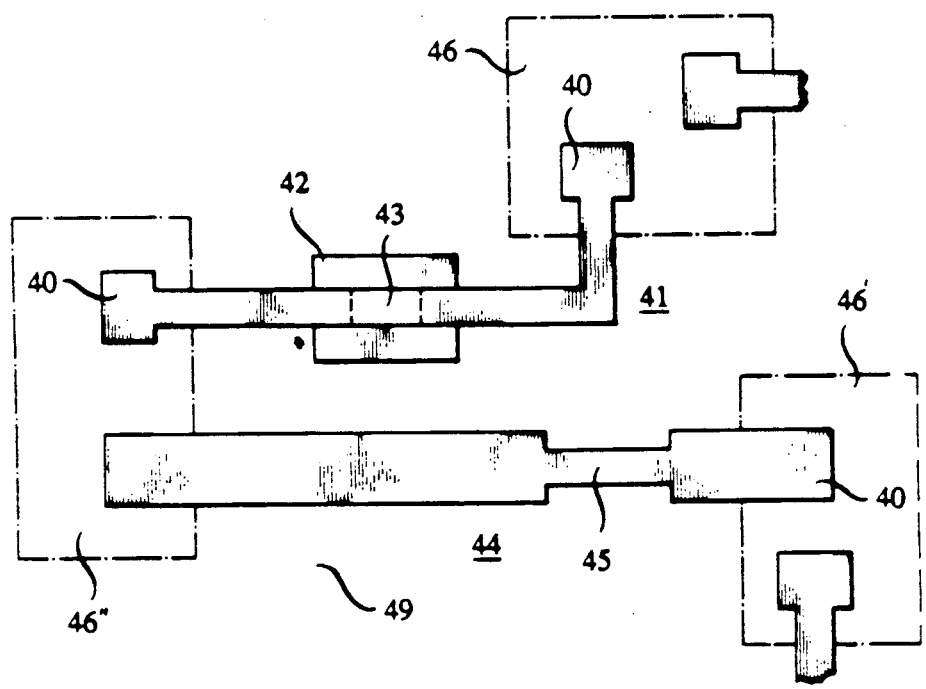
FIG. 4 schematically shows exemplary superconductive interconnects.

FIG. 4 schematically shows exemplary interconnects according to the invention. On an appropriate substrate 49 (e.g., a Si wafer, optionally with one or more passivating layers thereon) are disposed a variety of bonding pads 40, with superconductive connections between at least some of the pads. Exemplarily, connection 44 comprises a narrow section 45, with 45 having furthermore been exposed to ion bombardment such that the critical current density is reduced from a value $J_{ci}$ to an appropriate lower value $J_{cf}$. As a further example, interconnect 41 comprises a section 43 which was irradiated so as to reduce the critical current density of the irradiated material from $J_{ci}$ to an appropriate value $J_{cf}$. Section 43 is disposed over (or possibly overlain by) a layer 42 of normal metal (e.g., Ag) which serves as a shunt if section 43 becomes a normal conductor. Devices or subassemblies (schematically indicated by dashed outlines 46, 46', and 46") are typically attached to the substrate by means of the bonding pads, with the interconnects providing electrical connections between them. If the current through an interconnect according to the invention reaches a value that corresponds to $J_{cf}$ in the irradiated section (e.g., 45 or 43) the section becomes resistive, thereby limiting the current.

EXAMPLE

A 200 nm thick film of composition $YBa_2Cu_3O_7$ was produced by electron beam deposition of Ba, Y, and Cu in stoichiometric proportion (Ba from $BaF_2$, the others from elemental sources) on a strontium titanate substrate. The film was heat treated for 2 hours in $O_2$ at 800° C., furnace cooled in $O_2$ to 500° C. in $O_2$ for 15 minutes, followed by furnace cooling to about room temperature. The resulting film was superconducting, with $T_c(R=0)$ of 94K and $J_c(77K)$ of $1.16 \times 10^6$ A/cm$^2$. Irradiation of the room temperature film with $2 \times 10^{13}$ $Ne^+/cm^2$ (1 MeV) resulted in $J_c$ of $0.13 \times 10^6$ A/cm$^2$ and $T_c(R=0)$ of 88K.

What is claimed is:

1. Method of producing an article comprising a layer of superconductive oxide on a substrate, associated with at least a part of the superconductive oxide layer being a critical current density $J_{cf}$, the method comprising
    a) forming the layer of superconductive oxide on the substrate; and
    b) providing means for making electrical contact with the layer characterized in that
    c) associated with the at least part of the layer formed in step a) is an initial critical current density $J_{ci}$, and a critical temperature $T_c(R=0)$, with $J_{ci}>J_{cf}$, and the method comprises
    d) exposing the at least part of the oxide layer to a flux of particles, with the particle species, energy, and fluence selected such that the critical current density of the at least part of the oxide layer is reduced to $J_{cf}$ with the normalized change $\Delta T_c$ in $T_c(R=0)$ being less than 0.2 of the normalized change $\Delta J_c$ in $J_c$, where $\Delta T_c=(T_{cf}-T_{ci})/T_{cf}$ and $\Delta J_c=(J_{ci}-J_{cf})/J_{ci}$, and $T_{ci}$ and $T_{cf}$ are the initial and final value of the critical temperature $T_c(R=0)$, respectively.

2. The method of claim 1, wherein the superconductive oxide is a (La)-cuprate, (Ba)-cuprate, or (Bi)-cuprate, wherein step d) is carried out such that a nuclear energy between about 0.02 and about 0.4 eV/atom is deposited in the at least part of the oxide layer, and wherein the normalized change in $T_c(R=0)$ is at most 20% of the normalized change in $T_c$.

3. The method of claim 2, wherein the particles are ions selected from the group consisting of He, O, F, Ne, and Ar.

4. The method of claim 1, wherein $J_{cf} \lesssim 0.5 J_{ci}$, and wherein the change in $T_c(R=0)$ is at most about 10%.

5. The method of claim 1, wherein the article comprises a SQUID, the at least part of the oxide layer comprising a superconductive weak link, and wherein $J_{cf}$ is selected such that $2I_oL/\Phi_o$ is approximately equal to 1, where $I_o$ is the critical current through the weak link, L is the SQUID self-inductance, and $\Phi_o$ is the fundamental flux quantum.

* * * * *